United States Patent [19]

Jarrett et al.

[11] 4,339,669
[45] Jul. 13, 1982

[54] CURRENT RAMPING CONTROLLER CIRCUIT

[75] Inventors: Robert B. Jarrett, Tempe; James J. LoCascio, Mesa, both of Ariz.

[73] Assignee: Motorola, Inc., Schaumburg, Ill.

[21] Appl. No.: 166,866

[22] Filed: Jul. 8, 1980

[51] Int. Cl.³ .............................................. H03K 5/08
[52] U.S. Cl. .................................... 307/228; 307/254; 307/475; 328/183
[58] Field of Search ....................... 307/228, 254, 475; 328/183, 185, 186

[56] References Cited

U.S. PATENT DOCUMENTS 4,009,398 2/1977 Yamada et al. ...................... 307/228
4,109,166 8/1978 Clark, Jr. et al. .................... 307/228

Primary Examiner—Stanley D. Miller, Jr.
Assistant Examiner—B. P. Davis
Attorney, Agent, or Firm—Michael D. Bingham

[57] ABSTRACT

A circuit responsive to a supplied control input signal for alternately sourcing and sinking current at an output the values of which are accurately matched comprising a single current reference source and a single NPN current mirror circuit. The current reference source is unilaterally coupled to the output when the circuit is in a first mode of operation to provide the source current and is coupled to the NPN current mirror circuit which is rendered conductive in a second mode of operation to provide the input current to said current mirror. The output of the current mirror being coupled to the output sinks current thereat which is substantially equal to the input current supplied thereto. The NPN current mirrors comprises a pair of matched transistors having the bases and emitters interconnected at first and second nodes respectively. The collector of the first one of the matched transistors is coupled to the current reference source with the collector of the second transistor being coupled to the output of the circuit. A base current cancellation transistor is utilized to supply the base current drive to the two transistors.

9 Claims, 1 Drawing Figure

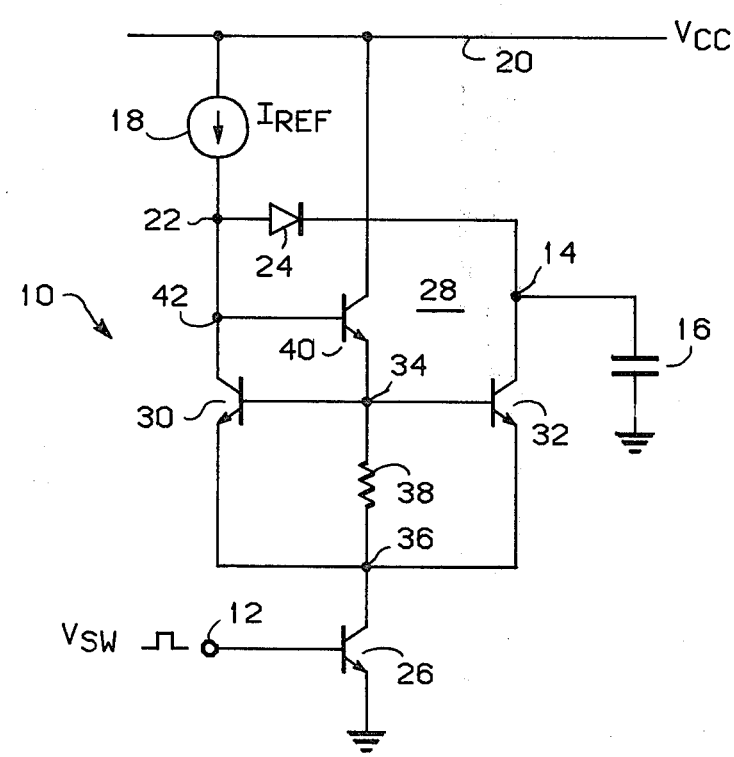

CURRENT RAMPING CONTROLLER CIRCUIT

REFERENCE TO RELATED PATENT APPLICATION

The subject matter of the subject application is related to the subject matter of patent application entitled "ANALOG TO DIGITAL INTERFACE CIRCUIT," Ser. No. 166,864 filed by Jarrett et al concurrently herewith and assigned to Motorola, Inc.

BACKGROUND OF THE INVENTION

1. Field of the Invention

This invention relates to current ramping controller circuits and more particularly, to a current ramping controller circuit for charging and discharging a capacitor by accurately matched currents.

2. Description of the Prior Art

There are many contemporary applications requiring ramping of capacitors and therefore the need for a ramping controller circuit for charging and discharging the capacitor. For instance, in most if not all of the electronic ignition systems available today at least one capacitor is utilized which is both charged and discharged accordingly to produce the spark signal which fires the spark plugs in correct time with the operation of the automobile engine. In such applications there is usually the need for generating both charge up and charge down currents for ramping the capacitor up and down wherein both these currents are of the same magnitude to minimize errors in the ignition system.

The method most recognized by the prior art for providing charge up and charge down currents uses a well known current mirror circuit wherein an input current is mirrored to an output. Thus, a PNP transistor current mirror circuit is utilized for providing a sourcing current which is a function of an input current provided thereto for charging the capacitor. Likewise, a NPN current mirror circuit is used for sinking current for discharging the capacitor wherein the sinking current is a function of an input current to the NPN current mirror circuit. A problem arises due to the capability of today's technology in matching the output current of the current mirrors to the input current supplied thereto. Typically, the best that these currents can be matched using contemporary integrated circuit techniques results in a 3% error between the two currents. Thus, in a circuit requiring a PNP current source and NPN current source as aforementioned, there is a possibility of having a maximum 6% error in the magnitudes of the currents which charge up and charge down the capacitor. In some applications this 6% error cannot be tolerated.

Thus, there exists a need for providing a current ramping controller circuit for providing charge and discharging currents for ramping a reference capacitor up and down where the two currents are accurately matched in value with respect to one another.

SUMMARY OF THE INVENTION

Accordingly, it is an object of the present invention to provide a current ramping controller circuit supplying sourcing at sinking current and an output where the currents have an accurately matched value.

Another object of the present invention is to provide a current ramping controller circuit requiring only a single reference current for providing both a sourcing and a sinking current at an output thereof.

Still another object of the present invention is to provide a current ramping controller circuit suitable for fabrication in integrated circuit form to be utilized for charging and discharging a capacitor with accurately matched current values.

In accordance with the foregoing and other objects there is provided a current ramping controller circuit suitable for use with a capacitor or the like for providing a current source for charging the capacitor and a source for sinking current at an output thereof for discharging the capacitor such that the charging and discharging currents have accurately matched values comprising a single current source for providing a reference current, the reference current being unilaterally provided at said output when the current ramping controller circuit is in a nominal mode of operation, a first circuit coupled to the current source which is rendered operative in response to a control signal applied to an input thereof and having an output connected to the output of the ramping controller circuit for providing a source for sinking current at said output, the magnitude of the sinking current being substantially equal to the value of the reference current.

In the preferred embodiment, the foregoing first circuit includes a pair of matched NPN transistors with the base electrodes interconnected at a first node and the emitter electrodes interconnected at a second node, the collector of the first one of the transistors being coupled to the current source and the collector of the other matched transistor being connected to the output of the ramping controller circuit. A third NPN transistor having its base-emitter path connected in parallel between the collector and base of the first one of the matched transistors with the collector being connected to a source of operating potential is provided wherein the emitter thereof is further coupled with the interconnected base of the matched transistors to a switching circuit for being rendered conductive in response to the control signal supplied to the input of the ramping controller circuit.

BRIEF DESCRIPTION OF THE DRAWING

The single drawing is a schematic diagram of the preferred embodiment of the present invention.

DETAILED DESCRIPTION OF THE PREFERRED EMBODIMENT

Turning to the single FIGURE there is shown current ramping controller circuit 10 of the preferred embodiment of the present invention. The ramping controller circuit 10 includes an input node 12 which is adapted to receive an input control switching signal, $V_{sw}$, and an output 14 which may be adapted to be coupled to capacitor 16 for instance. As understood, ramping controller circuit 10 is suitable to be manufactured in monolithic integrated form. Typically, capacitor 16 would be an external capacitor connected to an output pin of the integrated circuit which would in turn be coupled to node 14. However, it is to be understood that in any given application, capacitor 16 could be fabricated monolithically and be directly or indirectly coupled to node 14. As shown, ramping controller circuit 10 includes a single reference current source 18 which is coupled between a power supply conductor 20 at which is applied a source of operating potential $V_{cc}$ and node 22. Current source 18 provides a single reference current of the magnitude $I_{ref}$. As will be explained, whenever the ramping controller circuit is in a nominal operating state the current $I_{ref}$ is unilaterally coupled through diode 24 to node 14. Hence, the current $I_{ref}$ is sourced to capacitor 16 to charge the same at a rate proportional to the magnitude of current $I_{ref}$.

In response to input control signal $V_{sw}$ rendering transistor 26 conductive, current ramping controller circuit 10 is caused to be switched to a second mode of operation wherein a NPN current mirror circuit 28 sinks current at node 14 to discharge capacitor 16. As will be hereafter explained, the current mirror source 28 discharges capacitor 16 at a rate proportional to substantially the magnitude of $I_{ref}$ such that the charge up and charge down currents provided to capacitor 16 are substantially matched. Current mirror 28 is shown as including an input connected to node 22 and an output connected to node 14. Current mirror circuit 28 includes a pair of closely matched NPN transistors 30 and 32 having the bases thereof interconnected at node 34. The emitters of transistors 30 and 32 are interconnected at node 36. A resistor 38 is connected between nodes 34 and 36 to the emitter of NPN transistor 40. The base of transistor 40 is interconnected with the collector of transistor 30 at node 42 to node 22, the collector of transistor 40 is coupled to power supply conductor 20.

In response to the switching signal supplied at terminal 12, transistor 26, the emitter of which is connected to a terminal at which is supplied to ground reference potential, is rendered conductive such that this transistor operates as a switching circuit for rendering transistors 30, 32 and 40 conductive. In this mode of operation, transistor 26 becomes saturated such that the anode of diode 24, node 22, is biased at a voltage potential equal to the potential appearing across the base-to-emitter of transistor 30 which is less than the potential developed across capacitor 16, therefore diode 24 is reversed bias whereby the current $I_{ref}$ is then provided to node 42. In this mode of operation, transistor 40 provides the base current drive to transistors 30 and 32 to render these transistors conductive. Thus, transistor 40 acts as a base cancellation source for transistors 30 and 32. Transistor 30 being conductive sinks substantially all of the current $I_{ref}$ through the collector-emitter path thereof. Since transistor 30 is matched with transistor 32, the collector current through transistor 32 substantially the same as $I_{ref}$. In practice, it can be shown that the collector current of transistor 32 is equal to the value of $I_{ref}$ minus an error term ($2I_B$/beta): beta being the forward current gain of transistor 40. Hence, if beta is made quite large, for example, 100 or greater, which can be realized in present day integrated circuits, the error term is quite minimal such that the collector current of transistor 32 (which is utilized for discharging capacitor 16) is substantially equal to the value of $I_{ref}$ which charges the capacitor.

Thus, what has been described above, is a current ramping controller circuit which is a significant improvement over prior art in that the magnitude of the current sourced and the magnitude of the current sunk at the ouput terminal thereof are accurately matched while the number of components required to provide the function of the ramping controller circuit of the preferred embodiment of the invention is reduced. This in turn reduces the die area required to provide the above described function in integrated circuit form. An advantage of the present invention is that only NPN transistors are required to provide the function whereas contemporary prior art circuits require the use of both PNP and NPN transistors connected as current mirrors with the associated errors associated therewith. These errors are substantially reduced by the single NPN transistor current mirror utilized in the preferred embodiment.

We claim:

1. A current ramping controller circuit which is responsive to a control signal supplied to an input thereof for alternately sourcing and sinking current at an output thereof the values of which are substantially the same, comprising:

reference current source means for producing a reference current, said reference current being unilaterally sourced to the output when said control signal is in a first level state; and circuit means responsive to said control signal being in a second level state for sinking current at the output terminal having a value substantially equal to said sourcing current, said circuit means including a first matched pair of transistors each having first and second electrodes and a control electrode respectively, said control electrodes being interconnected at a first node, said first electrodes being interconnected at a second node, said second electrode of a first one of said matched pair of transistors being coupled to said reference current source means, the second electrode of the second one of said matched transistors being coupled to the output of the ramping controller circuit, and current cancellation means coupled between the second and control electrodes of said first one of said matched transistors for providing current drive to said first and second matched transistors such that current error is reduced in said circuit means whereby the sourcing current and the sinking current are substantially equal to one another, said current cancellation means being a transistor having first, second and control electrodes, said first electrode being coupled to the first node of said circuit means, said second electrode being coupled to a second terminal at which is supplied a source of operating potential, said control electrode being coupled to said second electrode of said first one of said matched transistors.

2. The ramping controller circuit of claim 1 wherein said circuit means further includes a switching transistor having first, second and control electrodes, said first electrode being coupled to a terminal at which is provided a ground reference potential, said second electrode being coupled to said second node, said control electrode being coupled to the input of the ramping controller circuit.

3. The ramping controller circuit of claim 2 including a diode coupled between said reference current source means and the output of the ramping controller circuit.

4. The ramping controller circuit of claim 3 wherein all of said transistors are NPN transistors.

5. A current ramping controller circuit which is responsive to a control signal supplied to an input thereof for alternately sourcing and sinking current at an output thereof the values of which are substantially the same, comprising:

reference current source means for producing a reference current, said reference current being unilaterally sourced to the output when said control signal is in a first level state; and circuit means responsive to said control signal being in a second level state to cause said reference current to be sourced to an input thereof for sinking current at the output terminal the value of which is substantially equal to said reference current, said circuit means including a first matched pair of transistors each having first and second electrodes and a control electrode respectively, said control electrodes being interconnected at a first node, said first electrodes being interconnected at a second node, said second electrode of said first one of said matched pair of transistors being coupled to said reference current source means, the second electrode of said second one of said matched transistors being coupled to the output of the ramping controller circuit, and current cancellation means coupled between the second and control electrodes of said first one of said matched transistors for providing current drive to said first and second matched transistors such that current error is reduced in said circuit means whereby the sourcing current and the sinking current are substantially equal to one another.

6. The ramping controller circuit of claim 5 wherein said circuit means further includes a switching transistor having first, second and control electrodes, said first electrode being coupled to a terminal at which is provided a ground reference potential, said second electrode being coupled to said second node, said control electrode being coupled to the input of the ramping controller circuit.

7. The ramping controller circuit of claim 6 wherein said current cancellation means being a transistor having first, second and control electrodes, said first electrode being coupled to the first node of said circuit means, said second electrode being coupled to a second terminal at which is supplied a source of operating potential, said control electrode being coupled to said second electrode of said first one of said matched transistors.

8. The ramping controller circuit of claim 7 including a diode coupled between said reference current source means and the output of the ramping controller circuit.

9. The ramping controller circuit of claim 8 wherein all of said transistors are NPN transistors.

* * * * *